US011152888B2

(12) United States Patent
Sablon et al.

(10) Patent No.: US 11,152,888 B2
(45) Date of Patent: Oct. 19, 2021

(54) HIGH EFFICIENCY PHOTOVOLTAIC CELLS WITH SUPPRESSED RADIATIVE EMISSION DUE TO CHEMICAL NONEQUILIBRIUM OF PHOTOELECTRONS

(71) Applicant: U.S. Army Research Laboratory ATTN: RDRL-LOC-I, Adelphi, MD (US)

(72) Inventors: Kimberly A. Sablon, Bowie, MD (US); Andrei V. Sergeyev, Silver Spring, MD (US); John W. Little, Ellicott City, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 97 days.

(21) Appl. No.: 15/710,947

(22) Filed: Sep. 21, 2017

(65) Prior Publication Data
US 2019/0036473 A1 Jan. 31, 2019

Related U.S. Application Data

(60) Provisional application No. 62/537,877, filed on Jul. 27, 2017.

(51) Int. Cl.
*H01L 31/028* (2006.01)
*H02S 10/30* (2014.01)
(Continued)

(52) U.S. Cl.
CPC .............. *H02S 10/30* (2014.12); *G02B 1/115* (2013.01); *G02B 5/285* (2013.01);
(Continued)

(58) Field of Classification Search
CPC .......... G02B 5/285; G02B 5/28; G02B 1/115; H01L 31/02168; H01L 31/0549;
(Continued)

(56) References Cited

U.S. PATENT DOCUMENTS 3,331,707 A * 7/1967 Werth ...................... H02S 10/30
136/253
5,403,405 A * 4/1995 Fraas ...................... H02S 10/30
136/253

(Continued)

OTHER PUBLICATIONS

W. Shockley and H. J. Queisser, "Detailed balance limit of efficiency of p-n junction solar cells," J. Appl. Phys. 32, 510 (1961).
(Continued)

*Primary Examiner* — Uyen M Tran
(74) *Attorney, Agent, or Firm* — Eric B. Compton

(57) ABSTRACT

Embodiments of the invention generally relates to photovoltaic, thermophotovoltaic, and laser power beaming devices which convert solar light, thermal radiation, or laser radiation into electric power. Said devices have a reflective interference "greenhouse" filter placed in front of a semiconductor cell and a reflective mirror on the back of the cell. The front filter is transparent for high energy (short wavelength) photons, but traps low energy (long wavelength) photons emitted by photocarriers accumulated near the semiconductor bandgap. In the optimized PV device, the chemical potential of photoelectrons near semiconductor bandgap exceeds the chemical potential of photoelectrons above the photonic bandgap established by the filter (i.e., the device is in chemical nonequilibrium). The greenhouse filter reduces the emission losses, decreases the semiconductor cell thickness, and provides PV conversion with reduced nonradiative losses. Said device converts radiative energy into electricity in a more efficient way than conventional cells.

21 Claims, 9 Drawing Sheets

(51) Int. Cl.

| | |
|---|---|
| *H01L 31/054* | (2014.01) |
| *H01L 31/056* | (2014.01) |
| *G02B 5/28* | (2006.01) |
| *G02B 1/115* | (2015.01) |
| *H01L 31/0216* | (2014.01) |
| *H01L 31/032* | (2006.01) |
| *H01L 31/0296* | (2006.01) |
| *H01L 31/0304* | (2006.01) |

(52) U.S. Cl.
CPC ...... *H01L 31/02168* (2013.01); *H01L 31/056* (2014.12); *H01L 31/0549* (2014.12); *H01L 31/028* (2013.01); *H01L 31/0296* (2013.01); *H01L 31/0304* (2013.01); *H01L 31/0322* (2013.01); *H01L 31/0326* (2013.01); *H01L 31/03046* (2013.01)

(58) Field of Classification Search
CPC ............. H01L 31/0304; H01L 31/0322; H01L 31/028; H01L 31/0296; H01L 31/0326; H01L 31/03046; H02S 10/30
See application file for complete search history.

(56) References Cited

U.S. PATENT DOCUMENTS

| | | | | |
|---|---|---|---|---|
| 5,700,332 | A * | 12/1997 | Brown | H01L 31/02167 136/253 |
| 7,790,978 | B1 * | 9/2010 | Dziendziel | G02B 5/208 136/253 |
| 2005/0121069 | A1 * | 6/2005 | Chou | H01L 31/0693 136/253 |
| 2013/0270589 | A1 * | 10/2013 | Kayes | H01L 33/38 257/95 |
| 2014/0090976 | A1 * | 4/2014 | Rotschild | H01G 9/2068 204/267 |

OTHER PUBLICATIONS

M. A. Osman and D. K. Ferry, "Monte Carlo investigation of the electron-hole-interaction effects on the ultrafast relaxation of hot photoexcited carriers in GaAs," Physical Review B vol. 36, No. 11, Oct. 15, 1987.

Chin-Yi Tsai, et al., "Effects of electron—hole energy transfer on the nonlinear gain coefficients in the small signal modulation response of semiconductor lasers," Appl. Phys. Lett. 71, 1747 (1997).

Peter Würfel, Physics of Solar Cells: From Principles to New Concepts, Chapter 7, "Limitations on Energy Conversion in Solar Cells," Wiley-VCH Verlag GmbH & Co. KGaA, Weinheim, Copyright 2005, ISBN: 3-527-40428-7.

B. M. Kayes, H. Nie, R. Twist, S. G. Spruytte, F. Reinhardt, I. C. Kizilyalli, and G. S. Higashi, "27.6% Conversion Efficiency, A new record for a single-junction solar cell under 1 sun illumination," Photovoltaic Specialists Conference (PVSC), 2011, 37th IEEE.

A. Polman and H.A. Atwater, "Photonic design principles for ultrahigh-efficiency photovoltaics," Nature Mater. 11, 174-177 (2012).

U. Rau and T. Kirchartz, "On the thermodynamics of light trapping in solar cells," Nature Mater. 13, 103-104 (2014).

A. Atwater and H.A. Polman reply [to the article of NPL7], Nature Mater. 13, 104-105 (2014).

K. Sablon et al., "Conversion of above- and below-bandgap photons via InAs quantum dot media embedded into GaAs solar cell," Applied Physics Letters 104, 253904 (2014).

Dr. Kimberly A. Sablon, Dr. Andrei Sergeyev, and Dr. John Little, slide presentation titled: "A Greenhouse Approach for Advance Tailoring of Photoelectrons and Photons in Ultra-Thin Solar Cells," presented at the Army Research Laboratory in Adelphi, MD on Jul. 29, 2016.

Andrei Sergeyev and Kimberly Sablon, "Shockley-Queisser Model: Analytical Solution, Thermodynamics, and Kinetics," cond-mat > arXiv:1704.0623 (Copy Dated: Aug. 28, 2017).

* cited by examiner

| Layer Name | Pattern | Materials | Thickness |
|---|---|---|---|
| air | | Air | 0. |
| Si | | silicon | 12.4269 |
| SiO2 | | SiO$_2$ | 184.435 |
| Si | | silicon | 4.85585 |
| SiO2 | | SiO$_2$ | 0. |
| Si | | silicon | 238.764 |
| SiO2 | | SiO$_2$ | 547.753 |
| Si | | silicon | 238.764 |
| SiO2 | | SiO$_2$ | 547.753 |
| Si | | silicon | 238.764 |
| SiO2 | | SiO$_2$ | 547.753 |
| Si | | silicon | 238.764 |
| SiO2 | | SiO$_2$ | 547.753 |
| Si | | silicon | 238.764 |
| SiO2 | | SiO$_2$ | 590.223 |
| Si | | silicon | 53.2631 |
| SiO2 | | SiO$_2$ | 44.728 |
| Si | | silicon | 153.094 |
| Clear InP | | Clear InP | 0. |

Figure 3A

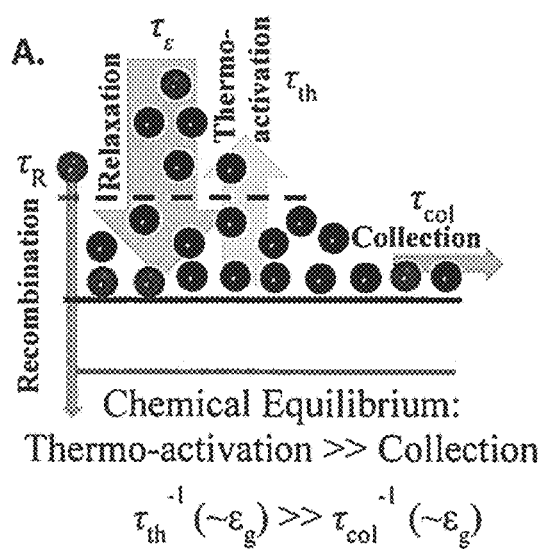 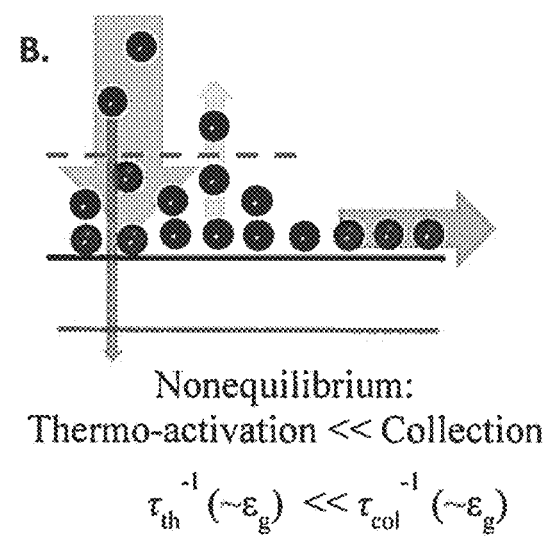
Figure 10A
Figure 10B

HIGH EFFICIENCY PHOTOVOLTAIC CELLS WITH SUPPRESSED RADIATIVE EMISSION DUE TO CHEMICAL NONEQUILIBRIUM OF PHOTOELECTRONS

CROSS REFERENCE TO RELATED APPLICATION(S)

This application claims the benefit of U.S. Provisional Patent Application No. 62/537,877, filed Jul. 27, 2017, herein incorporated by reference in its entirety for all purposes.

STATEMENT OF GOVERNMENT INTEREST

The invention described herein may be manufactured, used, and licensed by or for the United States Government without the payment of royalties.

FIELD OF INVENTION

The invention generally relates to a photovoltaic energy conversion device, which converts solar energy, thermal radiation energy, or laser beam energy into electric power.

BACKGROUND OF THE INVENTION

In photovoltaic (PV) energy conversion devices, the useful energy per photoelectron is given by the photoelectron chemical potential. Design, modeling, characterization, and optimization of conventional PV devices is based on a detailed balance condition, which assumes that photoelectrons and emitted photons are in chemical equilibrium.

This approximation works well for conventional PV and thermophotovoltaic (TPV) devices, because photon emission, photon reabsorption, photoelectron accumulation and photoelectron collection processes, all occur at the same narrow energy range near a semiconductor bandedge. The chemical potential of photoelectrons accumulated near the semiconductor bandedge and the chemical potential of photons emitted by these photoelectrons are the same. The photo-induced chemical potential determines the conversion efficiency.

The conversion efficiency is a key parameter of PV and TPV devices. The fundamental Shockley-Queisser (S-Q) theory [1] based on detailed balance establishes a maximal photo-induced chemical potential and corresponding maximal solar conversion efficiency. The S-Q model is based on three-stage photocarrier kinetics, which leads to the detailed balance condition, i.e. to the chemical equilibrium in the photoelectron subsystem as well as to the chemical equilibrium between photocarriers and emitted photons. At the first stage, light-induced carriers lose energy due to strong electron-phonon interaction. As a result, the photocarriers acquire an equilibrium temperature and relax to the semiconductor bandedge. At the second stage, the photocarriers emit photons that are subsequently reabsorbed and creating the electron-hole pairs again. Also, some photocarriers are excited to higher energy levels due to absorption of phonons and relax again due to phonon emission. The photon and phonon reabsorption processes establish chemical equilibrium in the photocarrier system as well as chemical equilibrium between photocarriers and emitted photons. Specifically, the photocarriers and emitted photons are described by the same temperature, T, and the same chemical potential, $\mu$. The corresponding light-induced distribution functions of photocarriers and emitted photons are $f_e = [\exp(\varepsilon-\mu)/kT+1]^{-1}$ and $f_{ph} = [\exp(\varepsilon-\mu)/kT-1]^{-1}$, respectively. At the third stage, the light-induced chemical potential of the photocarrier-photon system relaxes due to carrier collection at the device contacts and photon escape from the device. Photon escape and photocarrier collection establish stationary photon and photocarrier distribution functions, which may be approximated by the quasi-classical distribution, $f_{e(ph)} = \exp(\mu-\varepsilon)/kT$, because even in the case of the maximal solar light concentration, the light induced chemical potential is still substantially below the bandgap and the parameter $(\varepsilon-\mu)/kT$ is much larger than 1. The quasi-classical function may be factorized as $\exp(\mu/kT) \times \exp(-\varepsilon/kT)$ and, therefore, the flux of the emitted photons may be presented as $\dot{N}_{em}(\mu,T) = \exp(\mu/kT) \times \dot{N}_{em}(T)$, where $\dot{N}_{em}(T)$ is the emission flux in thermodynamic equilibrium ($\mu=0$). If nonradiative recombination is negligible, the electric current is determined by the difference between absorbed and emitted photon fluxes, $J/q = \dot{N}_{ab} - \dot{N}_{em}$.

The useful energy per collected electron is a chemical potential, $\mu$, and the photovoltaic conversion efficiency may be presented as $$\eta = \frac{J \cdot \mu}{q \cdot \dot{E}_{in}} = \frac{[\dot{N}_{ab} - \dot{N}_{em}(T) \cdot \exp(\mu/kT)] \cdot \mu}{\dot{E}_{in}} = \left(1 - \frac{\dot{N}_{em}(T)}{\dot{N}_{ab}} \cdot \exp\left(\frac{\mu}{kT}\right)\right) \cdot \frac{\mu}{\varepsilon^*} \quad (1)$$

where $\dot{E}_{in}$ is the power of incoming photon flux and $\varepsilon^* = \dot{E}_{in}/\dot{N}_{ab}$, is the average energy in the flux per absorbed photon.

The S-Q model has an exact analytical solution [2]. The maximal photo-induced chemical potential and maximal energy conversion efficiency are given by $$\mu_m = kT \cdot LW(A) \text{ and } \eta_m = (LW(A) - 1) \cdot \frac{kT}{\varepsilon^*}, \quad (2)$$

respectively, where $A = \dot{N}_{ab}/\dot{N}_{em}$, and LW is used for the Lambert W function.

The S-Q theory [1] establishes maximal conversion efficiency, which is determined by the ratio of the absorbed and emitted photon fluxes (right-hand side of equation 2), which depends only on a semiconductor bandgap. For conversion of unconcentrated solar light, a maximal efficiency of 33.7% is expected for a single junction with a semiconductor bandgap of 1.34 eV [1]. Gallium arsenide and silicon cells, common semiconductor materials, have maximal theoretical efficiencies about 33% and 32%, correspondingly. However, actual efficiencies are typically 5-6% below the theoretical limits. These losses are associated with imperfect tailoring of photons and photoelectrons in the critical region near the semiconductor bandgap. Shockley and Queisser demonstrated that high photovoltaic efficiency requires a high concentration of photoelectrons near the bandedge, which leads to strong emission of bandgap photons. While the S-Q model assumes 100% absorption of all above bandgap photons, including absorption near the bandgap, in real semiconductors the near-bandgap absorption is small.

Current research efforts have largely focused on photon trapping and recycling near the semiconductor bandgap, but show a limited success. For instance, it has been reported that the addition of the back-side mirror to GaAs cell has been shown to increase efficiency from 26% to 27.6% [3]. However, further enhancement of photon trapping via additional photon scattering and recycling does not significantly increase the efficiency. Moreover, recent scientific efforts [4, 5] have shown that while photon trapping is favorable for approaching the S-Q limit, it does not allow one to overcome the S-Q limit, given by Eq. 2.

To overcome the fundamental S-Q limit, which establishes the maximal energy conversion efficiency for a single junction PV device, one could modify at least one of the following conditions that are assumed in S-Q model and lead to the S-Q limit:

(i) All above-bandgap photons are absorbed.
(ii) All below-bandgap photons are lost.
(iii) Every above-bandgap photon excites one electron-hole pair.
(iv) All photocarriers reach thermal equilibrium with the lattice.
(v) All photocarriers and emitted photons reach the chemical equilibrium and are described by the same chemical potential.

According to the first condition, photon trapping, which increases the above-bandgap absorption, cannot increase efficiency above the S-Q limit because it is assumed that all above-bandgap photons are absorbed. To use the energy of below-bandgap photons (modifying (ii)), external photon up-conversion or intrinsic up-conversion via an intermediate electron band or localized levels may be employed. Currently, the efficiency of quantum dot (QD) solar cell with intrinsic up-conversion is limited to 19.6% [6]. Assumption (iii) is violated if a photon can create more than one electron-hole pair via multiple exciton generation (MEG). MEG processes are observed in colloidal QD solar cells. However, the efficiency of these devices is still about 7-9%. To avoid relaxation losses (condition (iv)), various solar cell designs were proposed and investigated. However, because of the fast electron-phonon processes the contribution of hot electrons to the conversion efficiency does not exceed 1%.

The subject of this invention, PV/TPV devices with chemical nonequilibrium in the photocarrier subsystem (violation of assumption (v)), have not been proposed nor considered to date.

BRIEF SUMMARY OF THE INVENTION

The present invention is directed to, among other things, improving efficiency of solar cells, thermophotovoltaic devices, and devices for conversion laser beam power. Combined photonic and electronic management establishes chemical nonequilibrium between low-energy photoelectrons that provide output electric power and high energy photoelectrons that determine emission from the PV device. This nonequilibrium operating regime suppresses the radiative emission losses and increases the conversion efficiency.

Embodiments of the invention include a reflective optical "greenhouse" filter (reflective interference filter) provided on or near the front surface of a semiconductor PV cell with back surface mirror. The filter establishes an optical bandgap which is larger (in terms of energy) or smaller (in terms of wavelength) than the semiconductor bandgap of the semiconductor PV cell. The greenhouse filter passes wavelengths a prescribed amount shorter than the bandgap wavelength of the PV device, and reflects wavelengths the prescribed amount longer than the bandgap wavelength of the PV device. The semiconductor cell is a n-p junction with a p-doped base. Because of the strong p-doping and high hole concentration, the incoming photons only change the chemical potential of electrons. High energy photoelectrons generated in the device by the short wavelength photons relax in energy (thermalize) to the semiconductor bandedge and radiatively recombine, emitting long wavelength photons with energies close to semiconductor bandgap. In conventional PV devices, this bandgap radiation is emitted out of the device, resulting in a substantial loss in converted energy. In the invention, the bandgap radiation is trapped by the filter and the back surface mirror and reabsorbed in the device. This increases the number of photoelectrons at the semiconductor bandedge which are subsequently collected as a photocurrent. The only radiative losses originate from recombination of photoelectrons with energies higher than the optical bandgap. Due to fast energy transfer from high energy photoelectrons to holes and/or to phonons, the density of the high energy photoelectrons and their chemical potential substantially decrease. The photons emitted from the device have the same chemical potential as the high energy photoelectrons that emit these photons. Chemical nonequilibrium between the accumulated carriers and the emitted photons increases the conversion efficiency, compared with the efficiency of conventional PV devices without the greenhouse filter.

In simple terms, the operation of the nonequilibrium PV device mimics the operation of a greenhouse, where the greenhouse glass/plastic reduces thermal emission from the greenhouse, and, in this way, keeps more thermal energy in the greenhouse. The invention combines this relatively simple greenhouse photonic management with electronic management, which allows effective conversion of thermal energy into electricity. The nonequilibrium photoelectron distribution, with reduced chemical potential of high energy electrons and increased chemical potential of low energy electrons, may be qualitatively described by a reduced temperature of photoelectrons. Therefore, the electronic management of the nonequilibrium PV device leads to the reduced temperature of photoelectrons and to enhanced conversion efficiency.

The nonequilibrium PV device with a greenhouse filter and a back surface reflector increases the conversion efficiency, potentially above the Shockley-Queisser (S-Q) limit, due to suppression of radiative emission in the cell. For solar light conversion, the nonequilibrium solar cell is expected to improve the conversion efficiency above the S-Q limit, up to around 44%.

These and other embodiments of the invention are described in more detail below.

BRIEF DESCRIPTION OF THE DRAWINGS

The foregoing and other objects, features, and advantages of the invention will be apparent from the following more detailed description of non-limiting embodiments of the invention, as illustrated in the accompanying drawings, wherein.

bandedge establishes the photonic bandgap, which is in the range 1.1-1.6 eV (1100-770 nm) for solar energy conversion.

Figure 3B:
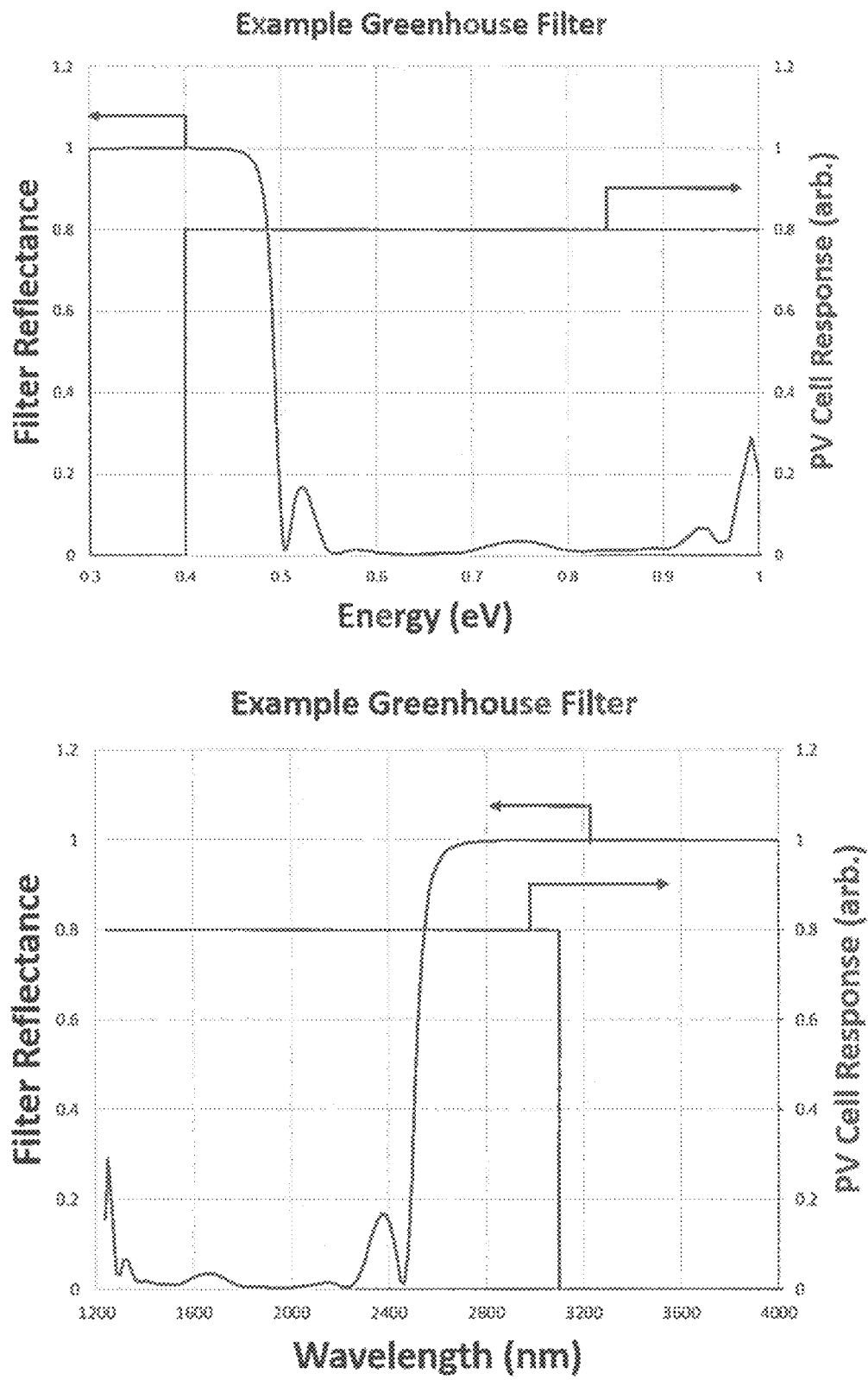

FIG. 3A shows an example of the combined greenhouse-TPV reflective filter with the photonic bandgap of 0.5 eV. In this case, the filter is a 1-dimensional photonic crystal, also referred to as a Bragg reflector. FIG. 3B shows the corresponding filtering depicted versus energy (top) and wavelength (bottom), according to one embodiment. Also shown in FIG. 3B are schematic representations of the spectral response of the PV device to illustrate the relative ordering of the optical and the semiconductor bandgaps.

Figure 4A:
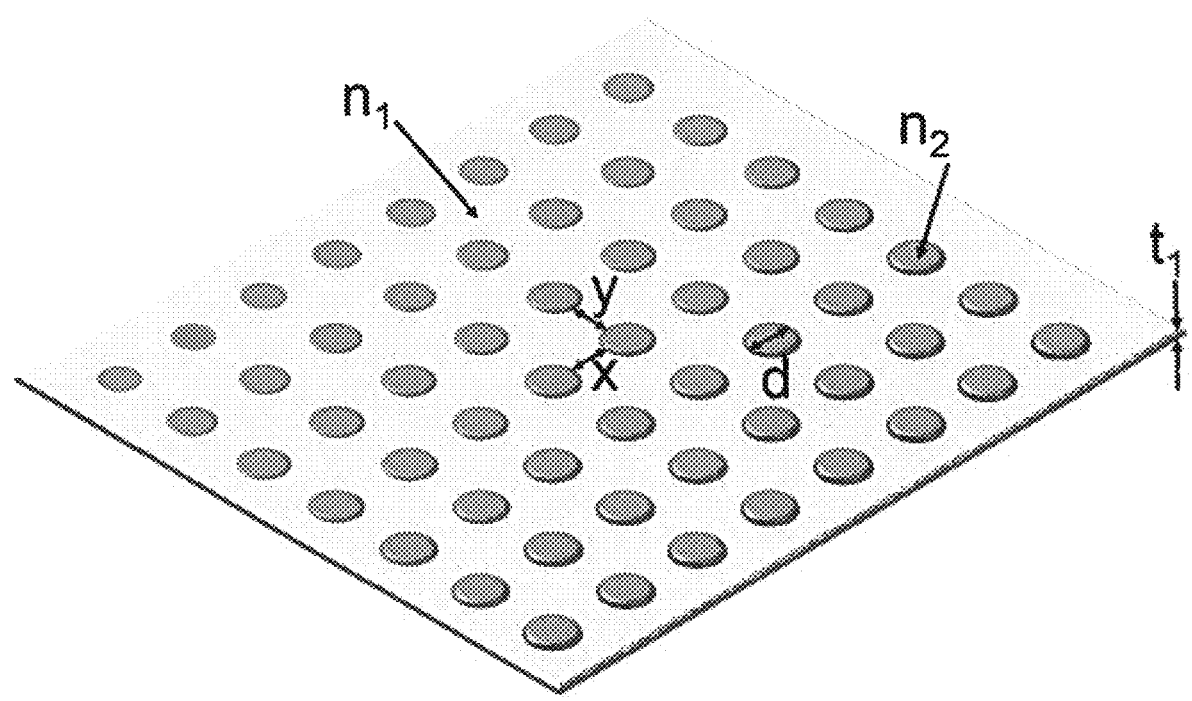
Figure 4B:
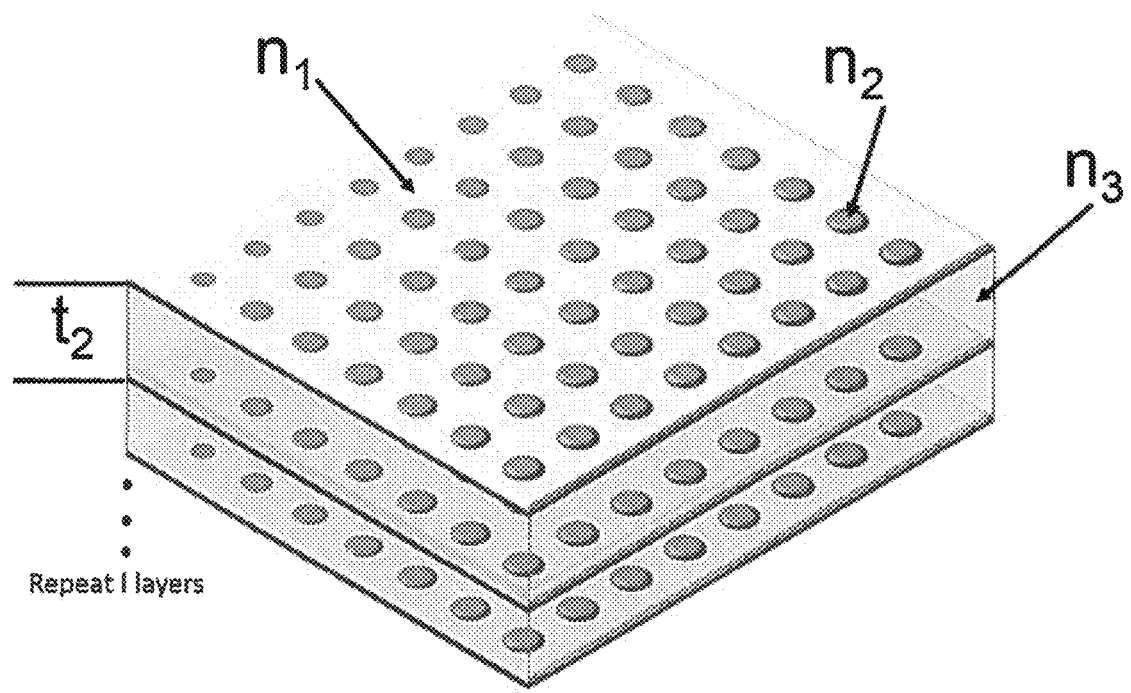

FIGS. 4A and 4B are schematic examples of 2- and 3-dimensional photonic crystals, respectively, forming a greenhouse filter according to embodiments. Here, materials of refractive index, where the subscript i is 1, 2 or 3, are arranged as shown to produce photonic crystals. The refractive indices and the dimensions of the index modulations can be chosen to produce the desired greenhouse filter.

Figure 5:
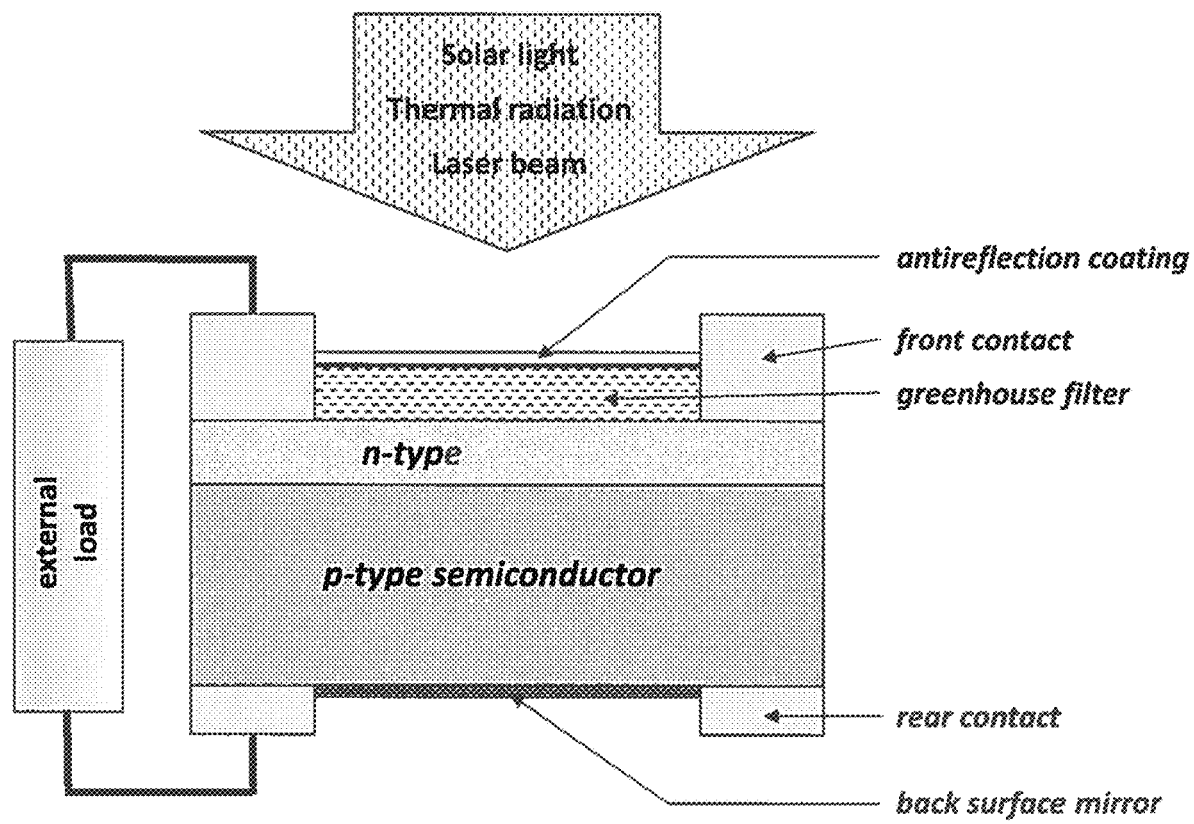

FIG. 5 depicts the schematic structure of the nonequilibrium PV device with the greenhouse filter, a single n-p junction semiconductor cell, and grid-type front and rear contacts according to an embodiment.

Figure 6:
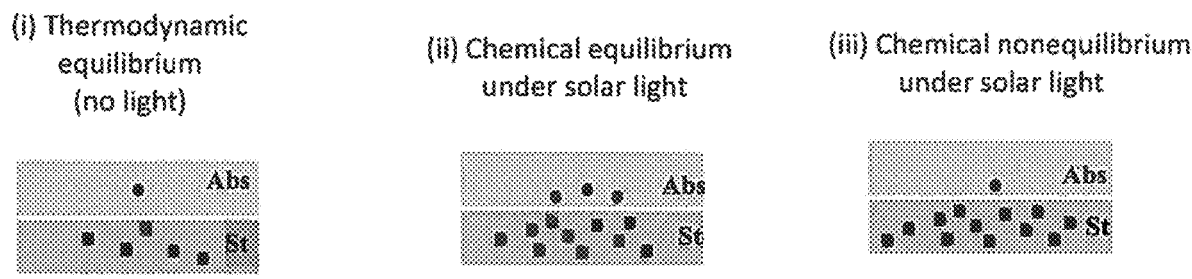

FIG. 6 depicts the distribution of electrons between Absorber (the energy interval above the photonic bandgap) and Storage (the energy interval from the semiconductor bandgap to the photonic bandgap) (without light (i), under the light in chemical equilibrium between absorber and storage (ii), and in the nonequilibrium operating regime (iii).

Figure 7:
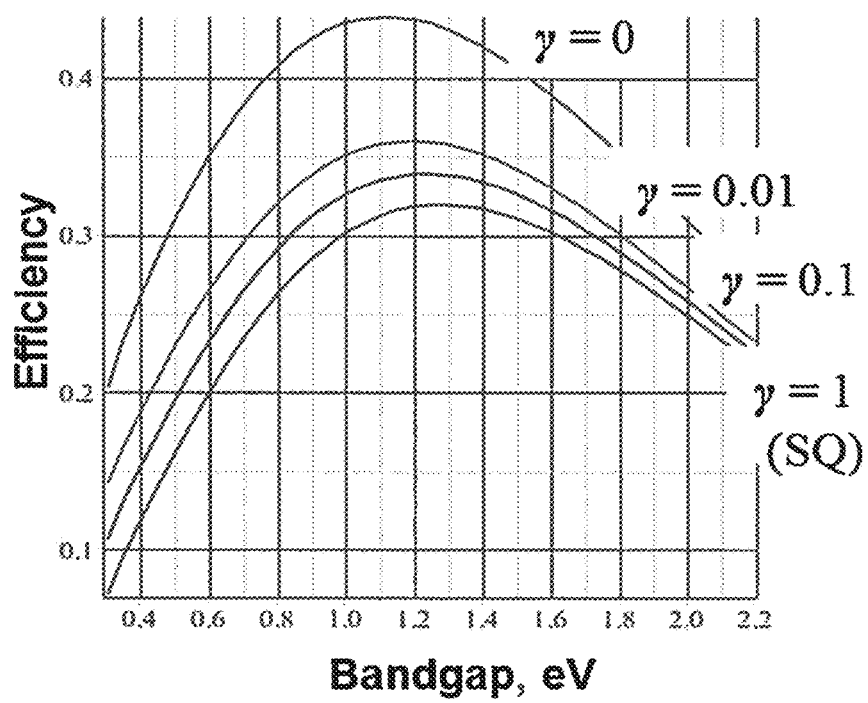

FIG. 7 is a plot showing that the photovoltaic efficiency vs the photonic bandgap at various values of γ, which is a measure of the degree of deviation from the chemical equilibrium condition.

Figure 8:
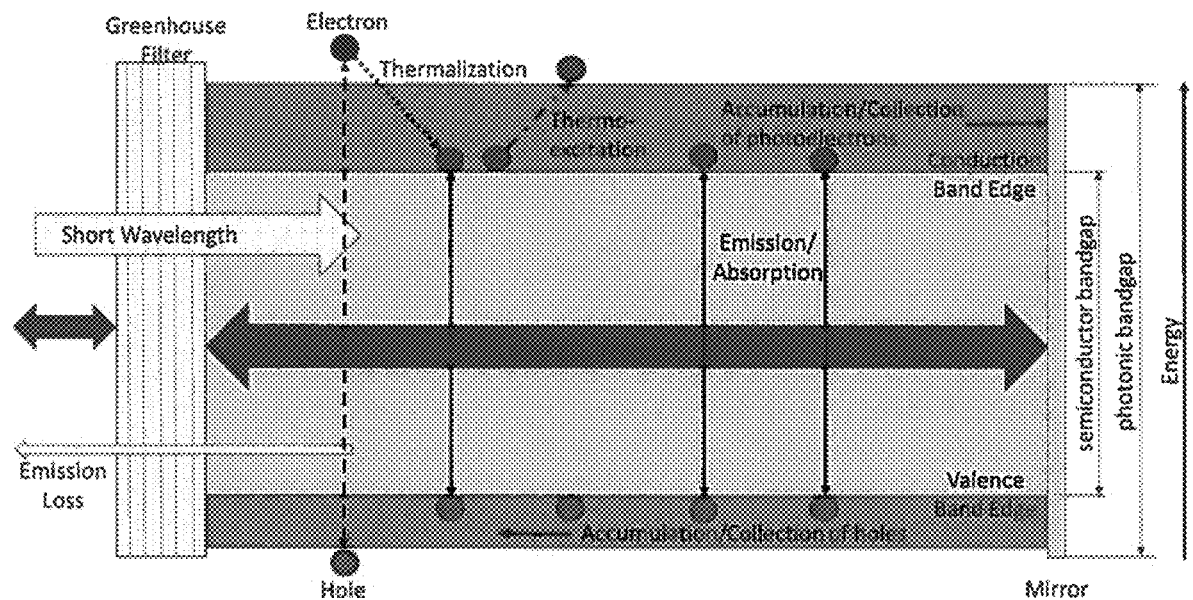

FIG. 8 shows photon and electron processes in the nonequilibrium PV device.

Figure 9:
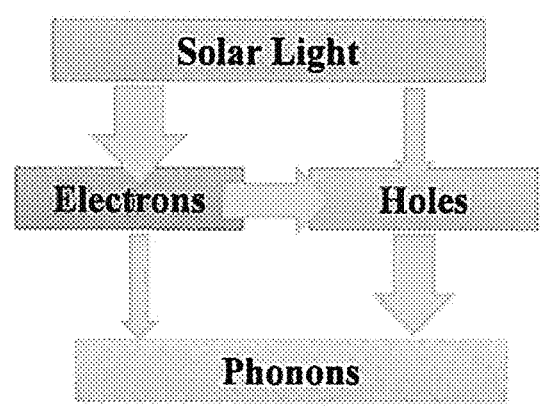

FIG. 9 shows the energy transfer, if the electron-hole interaction dominates over the electron-phonon interaction. Cooling of high energy photoelectrons due to their interaction with holes leads to the chemical nonequilibrium between high and low energy electrons.

FIGS. 10A and 10B show how (A) equilibrium, and (B) nonequilibrium operating regimes are controlled by the relation between the thermo-activation time and the carrier collection time.

A more complete appreciation of the invention will be readily obtained by reference to the following description and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF THE INVENTION

The present invention, thus, is directed to among other things, improving conversion efficiency of solar cells, thermophotovoltaic devices, and laser power beam conversion devices by employing photonic and electronic management that establishes an energy distribution of photoelectrons with increased chemical potential of low energy photoelectrons which provide the output electric power and reduced chemical potential of high energy electrons which emit photons able to escape from the device.

According to various embodiments, the photonic management in the nonequilibrium PV device mimics the greenhouse operation, which passes sunlight (high energy photons) inside, but traps the heat (low-energy photons). The electronic management in the nonequilibrium PV device provides the most effective conversion of the trapped thermal energy into electricity.

Figure 1:
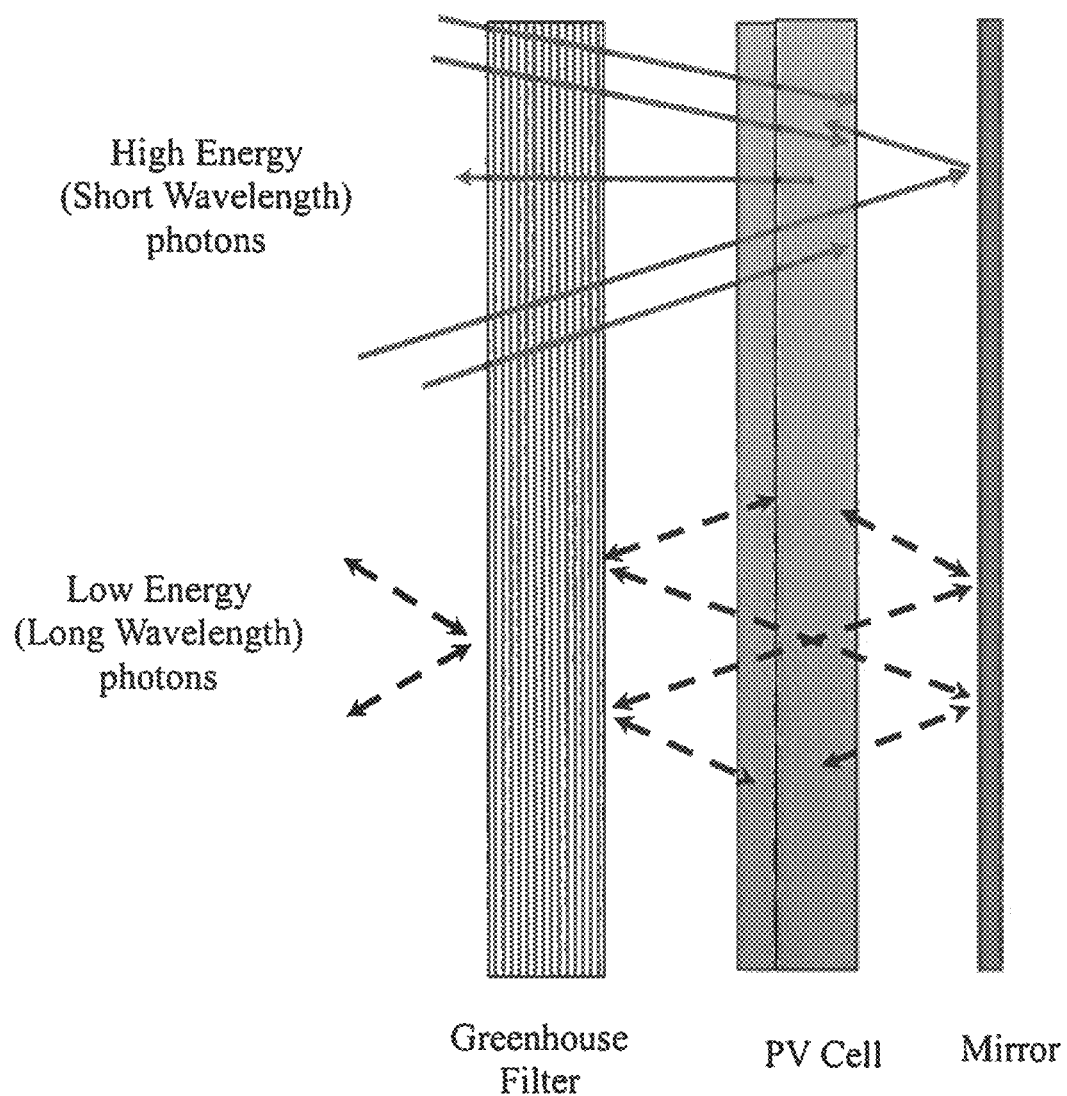
FIG. 1 is a schematic of the nonequilibrium PV device having a greenhouse filter according to embodiments. The device is generally composed of a front surface greenhouse filter and a single junction semiconductor cell (identified as PV cell) with a back surface mirror. The front surface greenhouse filter is configured to transmit high energy (short wavelength) photons shown by solid line arrows, but prevents escape of low energy (long wavelength) photons shown by dashed line arrows.

FIG. 1 is a schematic of the nonequilibrium energy converter having a greenhouse filter according to embodiments. The device is generally composed of a single junction semiconductor cell (identified as PV cell in FIG. 1) with a back surface mirror and a front surface greenhouse filter. The front surface greenhouse filter is configured to transmit high energy (short wavelength) photons, but prevents escape of low energy (long wavelength) photons emitted by the semiconductor PV cell. As it is shown in FIG. 1, the incoming short wavelength photons (solid arrows) are absorbed by the semiconductor PV cell. The incoming long wavelength photons (dashed arrows) do not penetrate through the filter and are not absorbed by semiconductor PV cell. Important that the long wavelength photons emitted by the semiconductor cell (dashed arrows between the filter and mirror in FIG. 1) are reflected by the back surface mirror and the front surface greenhouse filter. Thus, the long wavelength photons are strongly trapped in the nonequilibrium conversion device. Only short wavelength photons (the dashed arrow directed outside the device) can escape from the device through the filter.

As it is shown in FIG. 1, the back surface mirror and the front surface greenhouse filter establish the photonic bandgap, which splits the photon spectrum into the low energy photons tapped in the device and high energy photons, for which the filter is perfectly transparent. In the nonequilibrium PV device the photonic bandgap can exceed the semiconductor bandgap by 50-400 meV depending on semiconductor materials and device applications, for instance.

Note, while air gaps or spaces are depicted between the filter and the cell and between the PV cell and the back mirror, these gaps are for illustrative purposes only showing the photons and not a requirement. In fact, no gap is necessary between these elements at all (as shown in the embodiment of FIG. 5). The elements may be formed directly upon each other in a unitary or integrally stacked structure, for instance. Alternatively or additionally, other elements might be located in between so long as they do not detract from the operation of the filter and mirror elements.

While in the traditional photovoltaic devices the main PV processes, photocarrier collection and photonic emission, are determined by the photocarriers and photons that are in chemical equilibrium (i.e. they are described by the same photo-induced chemical potential), in the nonequilibrium device these two main functionalities are separated. The photocarrier collection is realized in the energy range near the semiconductor bandgap, but the photon escape from the device is only possible for photons with energies above the photonic bandgap. This provides a wide range of possibilities for optimization of the conversion processes. The nonequilibrium PV device is configured in such way that the energy gain due to reduced emission from the device dominates over the losses due to rejection of incoming low energy photons by the greenhouse filter.

The greenhouse filter is a reflective, interference, nonabsorptive blocking filter. The filter is characterized by a bandwidth in which the filter reflects photons, a low energy band edge (the long wavelength bandedge), a high energy bandedge (the short wavelength bandedge), low transparency in the blocking (rejection) band, high transparency outside the blocking band, and a transition characteristic between the maximal and minimal transmission. The spectral characteristics are presented in terms of energy of corresponding photons, $\varepsilon_{ph}$, or in terms of the photon wavelength, $\lambda$ ($\varepsilon_{ph}$=h·c/$\lambda$, where h=6.63×10$^{-34}$ J·s=4.1357× 10$^{-15}$ eV·s is Planck's constant and c=3.00×10$^8$ m/s is the light velocity in vacuum). The filter characteristics are presented in FIG. 2 and described below.

Figure 2:
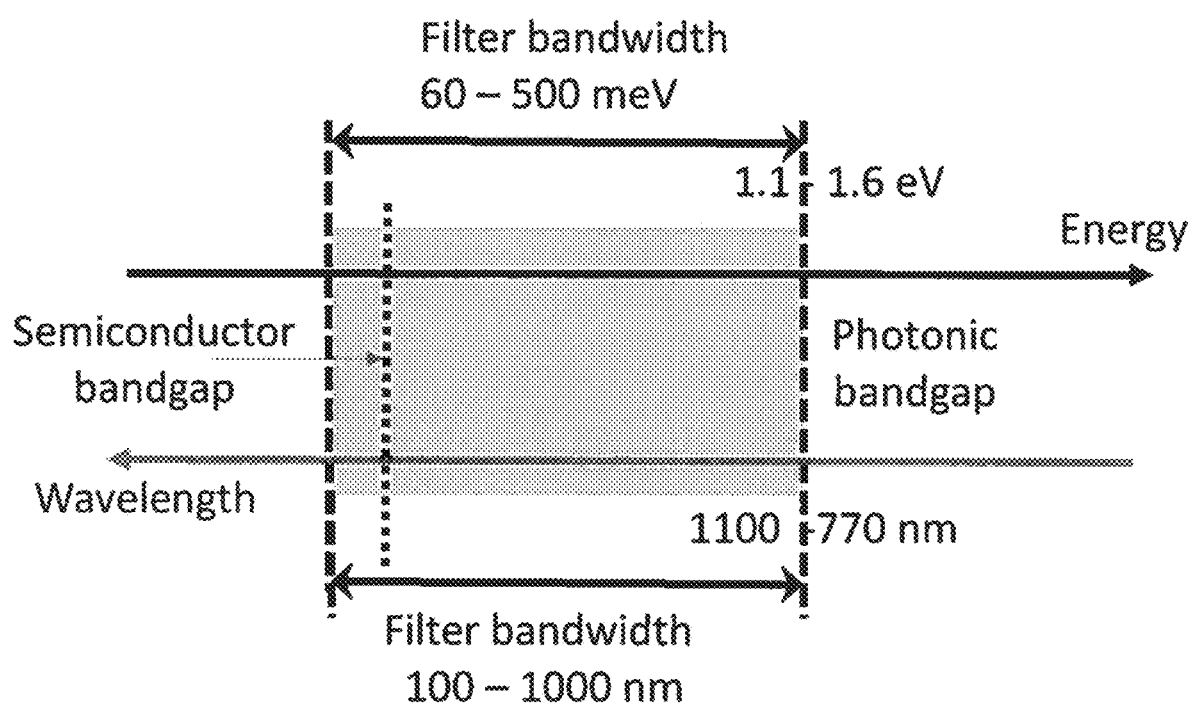
FIG. 2 depicts the energy/wavelength diagram of spectral characteristics of the filter. The low-energy (long wavelength) bandedge overlaps with a semiconductor bandgap shown by dotted line. The high-energy (short wavelength)

The greenhouse filter is configured to reject photons in the energy band from ~60 meV up to ~500 meV depending on applications (the filter bandwidth in FIG. 2). In the highly pure semiconductor materials, the photons with energies below the semiconductor bandgap do not absorbed by PV cell and do not participate in conversion processes. In this case, the filter bandwidth should cover only the energy range above the semiconductor bandgap. Doping of semiconductors leads absorption tails (the Urbach tails) below the semiconductor bandgap (the dotted line in FIG. 2). To avoid absorption and emission via Urbach tails, the low energy (long wavelength) band edge of the filter (the left dashed line) is always configured to be at least 10 meV below the semiconductor bandgap.

The greenhouse filter is configured to have high transmission above the photonic bandgap, i.e. the filter is transparent for photons with energies higher than the bandedge of the filter. As in ordinary PV devices, the transparency may be increased by application of an antireflection (AR) coating. The greenhouse filter is configured to have low transmission, e.g., at least below 0.05 eV, in the rejection band.

Because the low energy bandedge of the filter overlaps with the semiconductor bandgap, and above the high energy bandedge of the filter the emission is suppressed due to electronic management, there are no specific requirements for the sharpness of the transition characteristic of the filter. Therefore, low cost filters may be used in the nonequilibrium PV device.

The high energy band edge of the filter (the left dashed line in FIG. 2) establishes a value of the photonic bandgap, which is configured to optimize conversion efficiency for a specific application. For PV solar energy conversion the high energy (short wavelength) bandedge of the greenhouse filter is established in the range 1.1-1.6 eV (1100-770 nm wavelength), which corresponds to the optimal semiconductor bandgap range in Shockley-Queisser model. For example, for photovoltaic semiconductor material with bandgap of 1000 meV (copper indium selenide PV material), the low energy bandedge of the filter is 970 meV ($\lambda$=1278 nm) and the high energy bandedge can be from 1120 meV ($\lambda$=1110 nm) to 1600 meV ($\lambda$=780 nm).

In thermo-photovoltaic (TPV) systems, specific wideband TPV filters are used to reflect the photons with energies below the semiconductor bandgap back to the heater. In the nonequilibrium PV device for TPV conversion the TPV filter may be integrated with the greenhouse filter to provide reflection of the photons with energies below the photonic bandgap, which exceeds the semiconductor bandgap by 50-200 meV. For TPV conversion, the value of photonic bandgap is determined by optimization of efficiency and output power tradeoff characteristics.

In the power beaming applications, the energy is transmitted laser power and is converted into electric power by the PV device. For power beaming applications the high energy bandedge of the greenhouse filter is configured to be equal to the energy of photons emitted by the laser.

The greenhouse filter is an interference filter, which employs the interference of photons reflected from the interfaces between regions of different thicknesses and refraction indexes. The long wavelength modes destructively cancel each other in the forward direction and cannot propagate through the filter but are reflected instead. The filter spectral characteristics can be controlled by the thickness, the refractive index, and the location of the regions of different refractive index. The greenhouse filter may be a Bragg reflector manufactured by depositing multiple thin layers of dielectric material with different refractive indices. Typical high index dielectrics may include zinc sulfide (n=2.32) and titanium dioxide (n=2.4), the low index material may include magnesium fluoride (n=1.38) or silicon dioxide (n=1.49). The filter can be made by coating a glass substrate or the surface of a semiconductor PV cell with a series of optical coatings.

FIG. 3A shows an example of a combined greenhouse-TPV reflective filter with the photonic bandgap of 0.5 eV, and FIG. 3B shows the corresponding filtering depicted versus energy (top) and wavelength (bottom), according to one embodiment. Here, the filter is configured as a dielectric stack (Bragg) filter. It is comprised of a stack of alternating layers of silicon (Si) and silicon dioxide (SiO2). The exemplary thickness (in nm) of each of the layers is identified in the chart of FIG. 3A (note, a thickness of zero for one of the layers in the filter stack means that the optimized filter does not include this layer). This particular set of layers was determined using a transfer matrix calculation for transmission through a multilayer dielectric stack with an optimizer that is keyed to certain desired results (e.g., maximum reflectivity beyond a certain wavelength and minimum reflectivity below a certain wavelength. An anti-reflective (AR) portion of the stack is located at the top and bottom of the main filter stack. This ensures that the filter reflectivity is not affected by the top (air) and bottom (substrate) interfaces and is minimized in the pass band. Also shown in FIG. 3B are idealized PV responses showing the relative ordering of the semiconductor and the optical bandgaps.

The filter may be also manufactured as a Bragg reflector from n-type transparent conductive materials, such as graphene, indium tin oxide (ITO), fluorine doped tin oxide (FTO), doped zinc oxide, etc.

Alternatively, in other embodiments, the greenhouse filter could be constructed and fabricated as 2- or 3-dimensional (2D or 3D) photonic crystals, i.e. periodic dielectric structures with true photonic bandgaps. FIG. 4A shows an embodiment of a 2D photonic crystal comprising a planar dielectric layer with index of refraction $n_1$ and thickness $t_1$ with, in this embodiment, cylindrical regions of a different dielectric material with index $n_2$ embedded in, or deposited on top of, the layer with index $n_1$. The cylindrical regions have diameters, d, and are arranged in a periodic array with spacings labeled as x and y. The rendering of the crystal in the figure introduces perspective, however, all cylinders are assumed, in this embodiment to have the same dimensions. Note that in other embodiments of the 2D photonic crystal, the regions of index $n_2$ could be square, rectangular, or some other shape as determined by modeling of the characteristics of the filter. FIG. 4.B shows an embodiment of a 3D photonic crystal comprising m-number of layers of the above 2D crystal separated by a thickness, $t_2$, of a third dielectric material with index of refraction $n_3$. In other embodiments of the 3D crystal, different layers could have different ordering (periodicities) of the regions, n2 (e.g. hexagonal array). The values of the refractive indices, n1, n2, and n3, will have values ranging between 1 (for vacuum) to about 4 (for semiconductor dielectrics). Because of the general nature of interference filters, all of the dimensions, x, y, d, $t_1$, and $t_2$, are comparable to the wavelength (in the material) of the light being filtered and, therefore, are in the range of tens to thousands of nm for the light sources considered in this invention. All parameters should be chosen based on optimization models as described for FIG. 3.

The back surface mirror in the semiconductor photovoltaic cell may be a wideband Bragg reflector, photonic crystal reflector, metallic reflector with small absorption. The back surface mirror may be also a 2D-3D photonic crystal, a textured metal reflector to provide light scattering, which enhances absorption of photons with energy above the semiconductor bandgap. The back surface mirror may be directly incorporated into the semiconductor PV device or may be a detached back reflector.

The electric contacts to the semiconductor photovoltaic cell can be transparent conductors, metallic grids, or combination of metallic grids and transparent conductors. The schematic structure of the nonequilibrium PV device with the filter, n-p junction semiconductor sell, and grid-type contacts is shown in FIG. 5.

Photons with energies above the photonic bandgap enter to the nonequilibrium device through the greenhouse filter and are absorbed by the semiconductor solar cell. An absorbed photon creates an electron in the conduction band and a hole in the valence band. The energy of photon is $h\nu = hc/\lambda$ and the conduction and valence bands are separated by the semiconductor bandgap, $\varepsilon_g$. The excess energy, $h\nu - \varepsilon_g$, is distributed between the electron and the hole in the following way [7], $$E_e = (h\nu - \varepsilon_g) \cdot \frac{m_h}{m_h + m_e} \approx (h\nu - \varepsilon_g) \cdot \left(1 - \frac{m_e}{m_h}\right), \quad (3)$$

$$E_h = (h\nu - \varepsilon_g) \cdot \frac{m_e}{m_h + m_e} \approx (h\nu - \varepsilon_g) \cdot \frac{m_e}{m_h},$$

where $E_e$ is the energy of the electron in the conduction band, $E_h$ is the energy of the hole in the valence band, $m_e$ is the effective electron mass, and $m_h$ is the effective hole mass. In semiconductor materials the effective hole mass is usually substantially larger than the effective hole mass. For example, in GaAs these effective masses are $m_e = 0.067 \cdot m_0$ and $m_h = 0.45 \cdot m_0$, where $m_0$ is the free electron mass. According to Eq. 3, most of the excess energy is gained by the photoelectron, while the hole has energy close to the edge of the valence band. For this reason, the kinetics of photoelectrons is more flexible and controllable than the kinetics of photogenerated holes, which are initially accumulated near the edge of the valence band.

To manage the kinetics of photoelectrons, the semiconductor PV cell should be the n-p single junction diode with a p-doped base. The p-doping of the cell in the nonequilibrium PV device is realized with the same manufacturing methods and by the same dopants as doping of traditional photovoltaic devices. The maximal concentration of p-dopants is limited by Auger recombination processes [7].

For effective trapping of long wavelength photons, photon reabsorption in the semiconductor cell should dominate over photon escape through the filter. Low filter transparency, $t_r$, in the rejection band allows reduction of the cell thickness by a factor of $\sim 10 \cdot t_r$, compared with cells with no filter To provide effective absorption of low energy photons, the thickness of a traditional solar cell is $\sim 1/\alpha$, where $\alpha$ is the absorption coefficient of photons with energies close to semiconductor bandgap. Therefore, the thickness of the nonequilibrium PV device is $\sim 10 \cdot t_r/\alpha$. For example, a greenhouse filter with transparency of 0.01 (an optical density of the filter=2) allows for $\sim 10$ times reduction of the cell thickness in the greenhouse filter embodiments. The greenhouse filter with transparency of 0.001 (an optical density=3) provides 100 times reduction of the cell thickness. This greenhouse thickness reduction can be combined with any other approaches related to photon trapping to maximize conversion efficiency.

Overall, the thickness of the semiconductor cell in the nonequilibrium PV device is substantially reduced with respect the thickness of traditional PV device made of the same PV material, but without the greenhouse filter. Thinner layers are desirable, as parasitic recombination losses decrease with reduced thickness. The semiconductor photovoltaic cell is fabricated from various photovoltaic semiconductor materials, such as GaAs (gallium arsenide), InGaAs (indium gallium arsenide), InGaP (indium gallium phosphide), AlInP (aluminum indium phosphide), CdTe (cadmium telluride), CIGS (copper indium gallium (di) selenide), CZTS (copper zinc tin sulfide), Si (silicon), etc., which are p-doped and n-doped to fabricate the n-p junction. The semiconductor photovoltaic cell may be also fabricated from semiconductor nanoblocks, such as quantum well, quantum wires, and quantum dots.

The PV device of this invention operates in a nonequilibrium regime that can be described in the following way. The energy interval from the semiconductor bandgap to the photonic bandgap plays the role of a Storage region for low energy photocarriers. The energy interval above the photonic bandgap plays the role of an Absorber region for high energy photons. FIG. 6 depicts the distribution of photoelectrons between the Storage (St) and the Absorber (Abs) regions without light (i), under light in chemical equilibrium between absorber and storage (ii), and in the nonequilibrium operating regime (iii). As shown, the ratio of the carrier density in the Absorber region to the density in the Storage region in the chemical equilibrium regime (ii) is exactly proportional to the thermodynamic equilibrium regime (i) with a proportionality coefficient of $\exp(\mu/kT) \sim 10^{10}$, where kT is the thermal energy ($\sim 0.25$ meV at room temperature). In the chemical nonequilibrium regime (iii), the photoelectrons are moved from the Absorber to Storage and, in this way, the chemical potential of the electrons in Absorber is strongly reduced.

The conversion efficiency of the novel greenhouse PV/TPV/power beaming devices, according to embodiments, operating in the nonequilibrium regime, depends on the parameter $\gamma$, which is a measure of the degree of deviation from the equilibrium condition It is defined as follows:

$$\gamma = \frac{n_{ab}}{n_{st}} \bigg/ \frac{n_{ab}^{eq}}{n_{st}^{eq}} = \frac{n_{ab} \cdot n_{st}^{eq}}{n_{ab}^{eq} \cdot n_{st}} \ll 1 \quad (4)$$

where $n_{ab}$ is the photo-induced electron density in the Absorber, i.e. above the photonic bandgap, $n_{st}$ is the photo-induced electron density in Storage, i.e. above the semiconductor bandgap and below the photonic bandgap, $n_{ab}^{eqv}$ and $n_{st}^{eqv}$ are the equilibrium electron densities. A value of $\gamma = 1$ is the equilibrium condition (FIG. 6 (ii)).

The limit $\gamma = 1$, i.e. the chemical equilibrium, corresponds to the S-Q model for a PV device with a bandgap equal to the photonic bandgap. In the nonequilibrium PV device the parameter $\gamma$ is much smaller than 1 due to combined electronic and photonic management.

FIG. 7 is a plot of the photovoltaic efficiency vs. the photonic bandgap at various values of $\gamma$. The photovoltaic efficiency generally increase as the value of $\gamma$ decreases (i.e., as the deviation from equilibrium increases). A nonequilibrium photocarrier distribution between the above-photonic-bandgap levels and the near-semiconductor-bandgap levels increases the conversion efficiency. It is at a maximum of about 44% for γ approaching 0. Therefore, the greenhouse solar cell is predicted to substantially exceed the S-Q limit for conversion efficiency.

The chemical nonequilibrium is realized by managing photoelectron processes schematically shown in FIG. 8. The semiconductor conduction band and valence band are separated by the semiconductor bandgap. Short wavelength radiation with photon energies above the photonic bandgap (the arrow penetrating the greenhouse filter and directed into the device in FIG. 8) creates electron-hole pairs (the vertical dashed double-arrow in FIG. 8). Low energy radiation is reflected by the filter (the double-arrow that does not penetrate the filter). Most of the energy of high energy photons is gained by photoelectrons in the conduction band. Photoelectrons lose their energy and relax to the conduction bandedge due to interaction with holes and phonons. In particular, interaction with phonons leads to thermalization of the photoelectrons (the dotted arrow from high energy electron to low energy electron), i.e. the photoelectrons acquire the lattice temperature. The photogenerated electrons and holes are accumulated near the corresponding bandedges and collected at the contacts.

Electrons and holes also recombine and emit photons. The low energy photons are trapped between the filter and the back surface mirror (the double arrow between the filter and mirror). Emission losses are only possible when high energy photons with energies above the optical bandgap leave the device (the arrow directed outside of the device). To emit such a high-energy photon, a photoelectron must be thermally excited to the energies above the photonic bandgap (thermos-excitation is shown by the dashed-doted arrow from the low energy electron to high energy electron). Because of the reflective filter, radiation resulting from recombination of photocarriers near the bandedges is trapped in the semiconductor and is reabsorbed. Thus, instead of contributing to radiation losses in traditional PV devices, here the photons with energies slightly above the semiconductor bandgap results in an accumulation of carriers near the bandedges that can be collected as useful photocurrent.

The nonequilibrium PV operation with the chemical equilibrium may is realized by managing photoelectron processes by means of semiconductor material characteristics and/or by means of parameters of the filter. In any case, the chemical nonequilibrium is a result of violation of the detailed balance in photoelectron kinetics.

The chemical nonequilibrium may be realized due to strong interaction of photoelectrons with holes, which are created by strong p-doping. The detailed balance between electron-phonon relaxation and phonon-electron thermoexcitation is violated if the electron-hole relaxation dominates over electron-phonon interaction, as it is shown in FIG. 9. In this case the energy is mainly transferred from high energy photoelectrons to holes and then from holes to the phonons (thick arrows from solar light to electrons, from electrons to holes, and from holes to phonons). As a result, the photoelectrons depopulate the states with energies above the photonic bandgap, which results in the chemical nonequilibrium, condition presented in FIG. 6 (*iii*).

Photoelectron kinetics with a dominating role of the electron-hole interaction was observed in experiments with laser photoexcitations in some semiconductor material, in particular in undoped GaAs [8,9]. The p-doping strongly increases the energy transfer from electrons to holes.

Chemical nonequilibrium may be also realized due to a relatively long photoelectron thermoexcitation time (exceeding the photoelectron collection time). FIGS. 10A and 10B show two possible situations. FIG. 10A depicts detailed balance in the photoelectron subsystem, which requires that the thermoexcitation rate, $\tau_{th}^{-1}$, is faster than the carrier collection rate, $\tau_{col}^{-1}$. In this case, electron-phonon relaxation and phonon-electron thermoactivation establish the detailed balance before the photocarriers are collected. The opposite case, chemical nonequilibrium kinetics, is depicted in FIG. 10B. If the thermoexcitation rate, $\tau_{th}^{-1}$, is slower than the carrier collection rate, $\tau_{col}^{-1}$, the detailed balance between electron-phonon relaxation and phonon-electron thermoactivation is not established, which leads to chemical nonequilibrium, presented in FIG. 6 (*iii*).

For optimal PV conversion, the photoelectron collection time should be substantially shorter than the photoelectron lifetime. In the nonequilibrium PV device the photoelectron lifetime is determined by thermoexcitation of a photoelectron to the states above the photonic bandgap and by the recombination from this high energy state. If the thermoexcitation time is longer than the recombination time of the photoelectrons at energies above the photonic bandgap, the photoelectron lifetime is equal to the themoexcitation time. Thus, the no equilibrium regime is realized if the photoelectron lifetime is mainly determined by thermoexcitation processes, because the optimal photoelectron collection time is always much shorter than its lifetime.

The thermo-excitation process from the near bandedge of the semiconductor bandgap to the energies above the optical bandgap is determined by absorption of thermal optical phonons by photoelectrons. Therefore, the thermo-excitation time exponentially depends on the energy difference, ΔE, between semiconductor bandgap and the optical bandgap that is established by the greenhouse filter. The thermoactivation time may be evaluated as $\tau_{th}=\tau_0 \cdot (\Delta E/\varepsilon_{opt}) \cdot \exp(\Delta E/kT)$, where $\tau_0$ is the optical phonon emission time and $\varepsilon_0$ is the energy of optical phonon. Due to the exponential dependence, a difference, ΔE, of 100-200 meV provides a factor of 50-3000 in the thermoactivation time. For example, for a GaAs semiconductor cell, the thermoactivation to the high energies with ΔE=200 meV requires approximately 10 ns, which is longer than the recombination time from high energy electron states.

Combined management of photoelectron kinetics through the optimization of material parameters (such as p-doping level) and the filter parameters (such as the bandwidth) enhances the chemical nonequilibrium, which leads to reduced emission and enhanced conversion efficiency.

Aspects of this invention have been previously disclosed in a presentation titled: "A Greenhouse Approach for Advance Tailoring of Photoelectrons and Photons in Ultra-Thin Solar Cells," which was presented at the Army Research Laboratory in Adelphi, MD on Jul. 29, 2016, which was appended to the aforementioned '877 provisional patent application which was filed on Jul. 27, 2017.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof.

REFERENCES CITED ABOVE, AND INCORPORATED BY REFERENCE HEREIN IN THEIR ENTITIES

1. W. Shockley and H. J. Queisser, "Detailed balance limit of efficiency of p-n junction solar cells," *J. Appl. Phys.* Vol. 32, 510 (1961).
2. A. Sergeev and K. Sablon, "Shockley-Queisser Model: Analytical Solution, Thermodynamics, and Kinetics, arXiv preprint arXiv:1704.06234, (2017).
3. B. M. Kayes, H. Nie, R. Twist, S. G. Spruytte, F. Reinhardt, I. C. Kizilyalli, and G. S. Higashi, "27.6% Conversion Efficiency, A new record for a single junction solar cell under 1 sun illumination," Photovoltaic Specialists Conference (PVSC), 2011, 37th IEEE.
4. A. Polman and H. A. Atwater, "Photonic design principles for ultrahigh-efficiency photovoltaics," *Nature Mater.* Vol. 11, pp. 174-177 (2012).
5. U. Rau and T. Kirchartz, "On the thermodynamics of light trapping in solar cells," Nature Mater. Vol. 13, 103-104 (2014). Atwater and Polman Reply, Nature Mater. Vol. 13, pp. 104-105 (2014).
6. K. Sablon et al., "Conversion of above- and below-bandgap photons via InAs quantum dot media embedded into GaAs solar cell," *Applied Physics Letters* Vol. 104, 253904 (2014).
7. P. Wurfel, *Physics of Solar Cells: From Basic Principles to Advanced Concepts*, Wiley-VCH, 2009.
8. M. A. Osman and D. K. Ferry, "Monte Carlo investigation of the electron-hole-interaction effects on the ultrafast relaxation of hot photoexcited carriers in GaAs," Physical Review B, Vol. 36, pp. 6018-6032 (1987).
9. Chin-Yi Tsai, Fang-Ping Shih, Chih-Hsiung Chen, Tsu-Yin Wu, Tien-Li Sung, and Chin-Yao Tsai, "Effects of electron-hole energy transfer on the nonlinear gain coefficients in the small signal modulation response of semiconductor lasers," Applied Physics Letters, Vol. 71, pp. 1747-1749 (1997).

The invention claimed is:

1. A nonequilibrium photovoltaic energy conversion device comprising:
   a semiconductor photovoltaic cell having a front surface facing an energy source and an opposing back surface, said semiconductor photovoltaic cell having a semiconductor bandgap and a useable range for electrical generation for photons with energies above (wavelengths below) the semiconductor bandgap;
   a mirror positioned in back of the semiconductor photovoltaic cell; and
   a greenhouse filter positioned in front of the semiconductor photovoltaic cell,
   wherein the greenhouse filter is configured to reflect photons in a reflection bandwidth defined by a predetermined low-energy (long-wavelength) bandedge and a predetermined high-energy (short-wavelength) bandedge, the predetermined low-energy (long-wavelength) bandedge substantially corresponding to the semiconductor bandgap of the semiconductor photovoltaic cell and the predetermined high-energy (short-wavelength) bandedge being greater than the semiconductor bandgap, such that in the useable range of the semiconductor photovoltaic cell, the greenhouse filter passes high-energy (short-wavelength) photons and reflects low-energy (long-wavelength) photons so as to establish a photonic bandgap for the nonequilibrium photovoltaic energy conversion device above the semiconductor bandgap such that there is a chemical nonequilibrium between photoelectrons that emit photons with energies above the photonic bandgap and the photoelectrons above the semiconductor bandgap.

2. The nonequilibrium photovoltaic energy conversion device of claim 1, wherein the greenhouse filter is configured as a substantially non-absorptive, reflective optical filter.

3. The nonequilibrium photovoltaic energy conversion device according to claim 1, wherein the reflective bandwidth ranges from about 60 meV to about 500 meV.

4. The nonequilibrium photovoltaic energy conversion device according to claim 1, wherein the predetermined low-energy (long-wavelength) bandedge is about 10 meV below the semiconductor bandgap.

5. The nonequilibrium photovoltaic energy conversion device according to claim 1, wherein the greenhouse filter is formed by depositing and patterning thin layers of dielectric materials with high and low refractive indexes to form Bragg reflector, 1-dimensional, 2-dimensional, or 3-dimensional photonic crystals.

6. The nonequilibrium photovoltaic energy conversion device according to claim 5, wherein the greenhouse filter is formed of dielectric materials comprising zinc sulfide (the refractive index n=2.32), titanium dioxide (n=2.4), magnesium fluoride (n=1.38), or silicon dioxide (n=1.49).

7. The nonequilibrium photovoltaic energy conversion device according to claim 1, wherein the semiconductor photovoltaic cell comprises a semiconductor n-p junction cell with p-doped semiconductor base.

8. The nonequilibrium photovoltaic energy conversion device according to claim 7, wherein the thickness of the p-doped semiconductor base is approximately $10\,\text{tf}/\alpha$, where tf is the filter transparency in the rejection band and $\alpha$ is the absorption coefficient of the p-doped semiconductor base for photons above the semiconductor bandgap.

9. The nonequilibrium photovoltaic energy conversion device according to claim 1, wherein the mirror comprises: a Bragg reflector, a distributive Bragg reflector, a photonic crystal reflector, a smooth metallic reflector, or a textured metallic reflector.

10. The nonequilibrium photovoltaic energy conversion device according to claim 1, further comprising electric contacts to the semiconductor photovoltaic cell.

11. The nonequilibrium photovoltaic energy conversion device according to claim 10, wherein the electric contacts comprise transparent conductors, a metallic grid, or a combination thereof.

12. The nonequilibrium photovoltaic energy conversion device according to claim 1, wherein the semiconductor photovoltaic cell is formed of GaAs (gallium arsenide), InGaAs (indium gallium arsenide), InGaP (indium gallium phosphide), AlInP (aluminum indium phosphide), CdTe (cadmium telluride), CIGS (copper indium gallium (di) selenide), CZTS (copper zinc tin sulfide), or Si (silicon).

13. The nonequilibrium photovoltaic energy conversion device of claim 1, wherein the nonequilibrium photovoltaic energy conversion device is configured as a photovoltaic (PV) solar energy conversion device, thermo-photovoltaic (TPV) device or as a laser beam PV conversion device.

14. The nonequilibrium photovoltaic energy conversion device according to claim 13, configured for photovoltaic (PV) solar energy conversion, wherein the predetermined high-energy (short-wavelength) bandedge of the greenhouse filter is established in the range of about 1.1-1.6 eV.

15. The nonequilibrium photovoltaic energy conversion device according to claim 13, configured for thermo-photo-electric (TPV) conversion, wherein the predetermined high-energy (short-wavelength) bandedge of the filter is established in the range of about 50 meV-200 meV above the semiconductor bandgap and a bandwidth that is determined by the low energy emission of a thermal emitter.

16. The nonequilibrium photovoltaic energy conversion device according to claim 13, configured for laser beam conversion device, wherein the predetermined high-energy (short-wavelength) bandedge of the greenhouse filter is established to be below the quantum energy of a laser.

17. A chemical nonequilibrium photovoltaic energy conversion device characterized by having different chemical potentials for low-energy photocarriers which are near a semiconductor bandgap of the chemical nonequilibrium photovoltaic energy conversion device and for high-energy photocarriers which are above an optical bandgap of the chemical nonequilibrium photovoltaic energy conversion device, wherein a photo-induced chemical potential of the low-energy photocarriers accumulated near the semiconductor bandgap exceeds a chemical potential of the high-energy photocarriers above the optical bandgap, said chemical nonequilibrium photovoltaic energy conversion device comprising;
a semiconductor photovoltaic cell having a front surface facing an energy source and an opposing back surface, said semiconductor photovoltaic cell having a semiconductor bandgap and a useable range for electrical generation for photons with energies above (wavelengths below) the semiconductor bandgap of said semiconductor photovoltaic cell; and
a greenhouse filter configured to reflect photons in a reflection bandwidth defined by a predetermined low-energy (long-wavelength) bandedge and a predetermined high-energy (short-wavelength) bandedge, the predetermined low-energy (long-wavelength) bandedge substantially corresponding to the semiconductor bandgap of said semiconductor photovoltaic cell and the predetermined high-energy (short-energy) bandedge being greater than the semiconductor bandgap of said semiconductor photovoltaic cell, such that in the useable range of the semiconductor photovoltaic cell, the greenhouse filter passes high-energy (short-wavelength) photons and reflects low-energy (long-wavelength) photons.

18. The nonequilibrium photovoltaic energy conversion device according to claim 17, wherein a photovoltaic chemical nonequilibrium is established by heavy p-doping of a cell base of the semiconductor photovoltaic cell which leads to strong electron-hole interaction and to effective energy transfer from electrons to holes.

19. The nonequilibrium photovoltaic energy conversion device according to claim 17, wherein a photovoltaic chemical nonequilibrium is established by optimizing the photonic bandgap which leads to the condition that the photoelectron time of thermal excitation from the semiconductor bandgap of the chemical nonequilibrium photovoltaic energy conversion device to the photonic bandgap is longer than the recombination time of photoelectrons with energies at the photonic bandgap.

20. The nonequilibrium photovoltaic energy conversion device according to claim 13, configured for thermophotoelectric (TIN) conversion, and wherein the greenhouse filter is integrated with a TPV filter, the integrated filter combination being further configured to reflect the photons with energies below the photonic bandgap.

21. The nonequilibrium photovoltaic energy conversion device according to claim 1, wherein the greenhouse filter is configured to pass photons outside of the reflection bandwidth beyond the predetermined high-energy (short-wavelength) bandedge.

* * * * *